United States Patent
Fujimori et al.

(10) Patent No.: US 10,249,672 B2
(45) Date of Patent: Apr. 2, 2019

(54) IMAGE PICKUP APPARATUS, SEMICONDUCTOR APPARATUS, AND IMAGE PICKUP UNIT

(71) Applicant: OLYMPUS CORPORATION, Tokyo (JP)

(72) Inventors: Noriyuki Fujimori, Suwa (JP); Takatoshi Igarashi, Ina (JP); Kazuhiro Yoshida, Nagano (JP)

(73) Assignee: OLYMPUS CORPORATION, Tokyo (JP)

( * ) Notice: Subject to any disclaimer, the term of this patent is extended or adjusted under 35 U.S.C. 154(b) by 182 days.

(21) Appl. No.: 14/556,831

(22) Filed: Dec. 1, 2014

(65) Prior Publication Data

US 2015/0085094 A1 Mar. 26, 2015

Related U.S. Application Data

(63) Continuation of application No. PCT/JP2013/060344, filed on Apr. 4, 2013.

(30) Foreign Application Priority Data

May 30, 2012 (JP) .................................. 2012-123224

(51) Int. Cl.
*H01L 27/146* (2006.01)
*H01L 25/04* (2014.01)
(Continued)

(52) U.S. Cl.
CPC .... *H01L 27/14636* (2013.01); *H01L 23/3114* (2013.01); *H01L 24/32* (2013.01);
(Continued)

(58) Field of Classification Search
CPC ..... A61B 1/00; A61B 1/00045; A61B 1/0005; A61B 1/00052; H04N 2005/2255
(Continued)

(56) References Cited

U.S. PATENT DOCUMENTS 6,472,247 B1 10/2002 Andoh et al.
2004/0130640 A1* 7/2004 Fujimori ............... H01L 23/481
348/294
(Continued)

FOREIGN PATENT DOCUMENTS

CN 101383359 A 3/2009
JP S50-081164 A 7/1975
(Continued)

OTHER PUBLICATIONS

International Search Report dated Jun. 4, 2013 issued in PCT/JP2013/060344.

(Continued)

*Primary Examiner* — Mehrdad Dastouri
*Assistant Examiner* — Kristin Dobbs
(74) *Attorney, Agent, or Firm* — Scully, Scott, Murphy & Presser, P.C.

(57) ABSTRACT

An image pickup apparatus includes: an image pickup chip including a light receiving section and electrode pads, on a first main face, and a plurality of connection electrodes, each of which is connected to each of the electrode pads via each of a plurality of through-hole interconnections, on a second main face; a transparent cover glass having a larger plan-view dimension than the image pickup chip; a transparent adhesive layer that bonds the first main face of the image pickup chip and the cover glass; and a sealing member that covers a side face of the image pickup chip and a side face of the adhesive layer, and is made of an insulating material having a same plan-view dimension as the cover glass.

13 Claims, 12 Drawing Sheets

(51) Int. Cl.
*H01L 23/31* (2006.01)
*H01L 23/00* (2006.01)
*H04N 5/369* (2011.01)

(52) U.S. Cl.
CPC ...... *H01L 25/042* (2013.01); *H01L 27/14618* (2013.01); *H01L 27/14683* (2013.01); *H04N 5/369* (2013.01); *H01L 2224/32225* (2013.01); *H01L 2924/0002* (2013.01); *H01L 2924/12042* (2013.01)

(58) Field of Classification Search
USPC .......................................................... 348/65
See application file for complete search history.

(56) References Cited

U.S. PATENT DOCUMENTS

| | | | |
|---|---|---|---|
| 2009/0059055 A1* | 3/2009 | Nakano | H01L 27/14618 348/340 |
| 2009/0256260 A1* | 10/2009 | Nakamura | H01L 27/14618 257/758 |
| 2010/0025710 A1 | 2/2010 | Yamada et al. | |
| 2010/0248425 A1* | 9/2010 | Hashimoto | H01L 21/78 438/113 |
| 2011/0080474 A1* | 4/2011 | Igarashi | H01L 27/14618 348/65 |

FOREIGN PATENT DOCUMENTS

| | | |
|---|---|---|
| JP | S51-061775 A | 5/1976 |
| JP | S56-048142 A | 5/1981 |
| JP | H05-166853 A | 7/1993 |
| JP | H05-182997 A | 7/1993 |
| JP | H06-177178 A | 6/1994 |
| JP | 2827795 B2 | 11/1998 |
| JP | 2001-035972 A | 2/2001 |
| JP | 2002-009206 A | 1/2002 |
| JP | 2002-034910 A | 2/2002 |
| JP | 2002-231920 A | 8/2002 |
| JP | 2002-329852 A | 11/2002 |
| JP | 2003-100943 A | 4/2003 |
| JP | 2003-100998 A | 4/2003 |
| JP | 2003-335922 A | 11/2003 |
| JP | 2004-296739 A | 10/2004 |
| JP | 2005-25074 A | 1/2005 |
| JP | 2005-166692 A | 6/2005 |
| JP | 2005-206768 A | 8/2005 |
| JP | 2008-130738 A | 6/2008 |
| JP | 2009-064839 A | 3/2009 |
| JP | 2009-158873 A | 7/2009 |
| JP | 2009-537970 A | 10/2009 |
| JP | 2010-212297 A | 9/2010 |
| JP | 2010-263199 A | 11/2010 |
| JP | 2011-243596 A | 1/2011 |
| JP | 2013-254984 A | 12/2013 |
| WO | 2005/022631 A1 | 3/2005 |
| WO | 2010/119762 A1 | 10/2010 |

OTHER PUBLICATIONS

Extended Supplementary European Search Report dated Apr. 19, 2016 in related European Application No. 13 79 7706.2.
European Patent Office Communication dated Aug. 15, 2018 in corresponding European Patent Application No. 13 797 706.2.

* cited by examiner

IMAGE PICKUP APPARATUS, SEMICONDUCTOR APPARATUS, AND IMAGE PICKUP UNIT

CROSS REFERENCE TO RELATED APPLICATION

This application is a continuation application of PCT/JP2013/060344 filed on Apr. 4, 2013 and claims benefit of Japanese Application No. 2012-123224 filed in Japan on May 30, 2012, the entire contents of which are incorporated herein by this reference.

BACKGROUND OF THE INVENTION

1. Field of the Invention

The present invention relates to an image pickup apparatus, a semiconductor apparatus, and an image pickup unit produced by a WL-CSP method.

2. Description of the Related Art

A chip size package (CSP) method has been used for downsizing semiconductor apparatuses. In the CSP, in a semiconductor chip where a semiconductor circuit section is formed on a first main face, a through-hole interconnection is formed up to a second main face, and an external connection terminal on the second main face is connected to an interconnection board.

Here, in a small image pickup apparatus, a transparent support member that protects a light receiving section that is the semiconductor circuit section is joined to a first main face of an image pickup chip on which the light receiving section is formed. A wafer level chip size package (WL-CSP) method has been used for collectively fabricating a plurality of image pickup apparatuses. In the WL-CSP, an image pickup chip substrate on which a plurality of light receiving sections are formed, and a transparent support substrate are subjected to machining such as formation of through-hole interconnections in a joined wafer state in which the image pickup chip substrate and the transparent support substrate are bonded via an adhesive layer. After that, the joined wafer is individualized into individual image pickup apparatuses.

Note that Japanese Patent Application Laid-Open Publication No. 2011-243596 discloses a method for producing a package component by a CSP method in which semiconductor chips mounted on a mounting face of a silicon wafer are sealed by a sealing resin, and the silicon wafer is then polished or the like from an opposite face to the mounting face, and further individualized into individual package components.

That is, in the above production method, the semiconductor chips are not machined, but the silicon wafer is machined to become an interposer for the semiconductor chips.

Since the image pickup apparatus produced by the WL-CSP method is ultra-small, the image pickup apparatus is particularly suited to be disposed at a distal end portion of an insertion section of an endoscope.

SUMMARY OF THE INVENTION

An image pickup apparatus of an embodiment of the present invention includes: an image pickup chip including a light receiving section and electrode pads formed around the light receiving section, on a first main face, and a plurality of connection electrodes, each of which is connected to each of the electrode pads via each of a plurality of through-hole interconnections, on a second main face; a transparent support substrate section having a larger plan-view dimension than the image pickup chip; a transparent adhesive layer that bonds the first main face of the image pickup chip and the support substrate section; and a sealing member that covers a side face of the image pickup chip and a side face of the adhesive layer, and is made of an insulating material having a same plan-view dimension as the support substrate section.

Also, a semiconductor apparatus of another embodiment includes: a semiconductor chip including a semiconductor circuit section and electrode pads formed around the semiconductor circuit section, on a first main face, and a plurality of connection electrodes, each of which is connected to each of the electrode pads via each of a plurality of through-hole interconnections, on a second main face; a support substrate section having a larger plan-view dimension than the semiconductor chip; an adhesive layer that bonds the first main face of the semiconductor chip and the support substrate section; and a sealing member that covers a side face of the semiconductor chip and a side face of the adhesive layer, and is made of an insulating material having a same plan-view dimension as the support substrate section.

An image pickup unit of yet another embodiment includes: an image pickup apparatus including an image pickup chip including a light receiving section and electrode pads connected to the light receiving section, on a first main face, and a plurality of connection electrodes, each of which is connected to each of the electrode pads via each of a plurality of through-hole interconnections, on a second main face, a transparent support substrate section having a larger plan-view dimension than the image pickup chip, a transparent adhesive layer that bonds the first main face of the image pickup chip and the support substrate section, and a first sealing member that covers a side face of the image pickup chip and a side face of the adhesive layer, and is made of an insulating material having a same plan-view dimension as the support substrate section; a lens unit that forms an object image on the light receiving section; a signal cable that is connected to the connection electrodes via an interconnection board; and a shield case in which the image pickup apparatus and the interconnection board are sealed by a second sealing member and accommodated, and that is made of a metal material.

DETAILED DESCRIPTION OF THE PREFERRED EMBODIMENT

<Embodiment>

Figure 1:
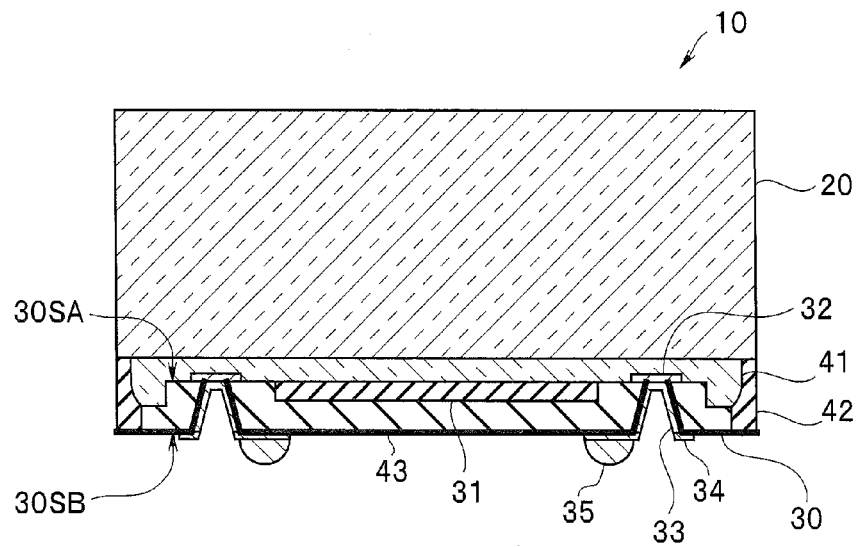
FIG. 1 is a sectional view of an image pickup apparatus of a first embodiment.

As shown in FIG. 1, in an image pickup apparatus 10 that is a semiconductor apparatus, an image pickup chip (imager chip) 30, and a cover glass 20 that is a support substrate section (transparent flat plate section) are bonded via an adhesive layer 41 made of a transparent resin. A light receiving section 31 that is a semiconductor circuit section is formed on a first main face 30SA of the image pickup chip 30, and a plurality of electrode pads 32 connected to the light receiving section 31 by an interconnection (not shown) are further formed around the light receiving section 31 of the first main face 30SA. An electrode pad 32 is connected to an external connection electrode 34 and an external connection terminal 35 on a second main face 30SB via a through-hole interconnection 33. That is, the plurality of electrode pads 32 supply electricity to the light receiving section 31, and transmit and receive input and output signals to and from the light receiving section 31. Moreover, outer peripheral portions of the image pickup chip 30 and outer peripheral portions of the adhesive layer 41 are covered with a sealing member 42 with no gap therebetween.

An insulating layer 43 covers and protects a surface of the sealing member 42 and the second main face 30SB of the image pickup chip 30 as well as covering a wall face of a through-hole via to effect insulation between silicon as a base material of the image pickup chip 30 and the through-hole interconnection 33. Furthermore, a region of the second main face 30SB other than an external connection terminal formation region is covered with the insulating layer 43 and a protective layer 44.

Figure 2:
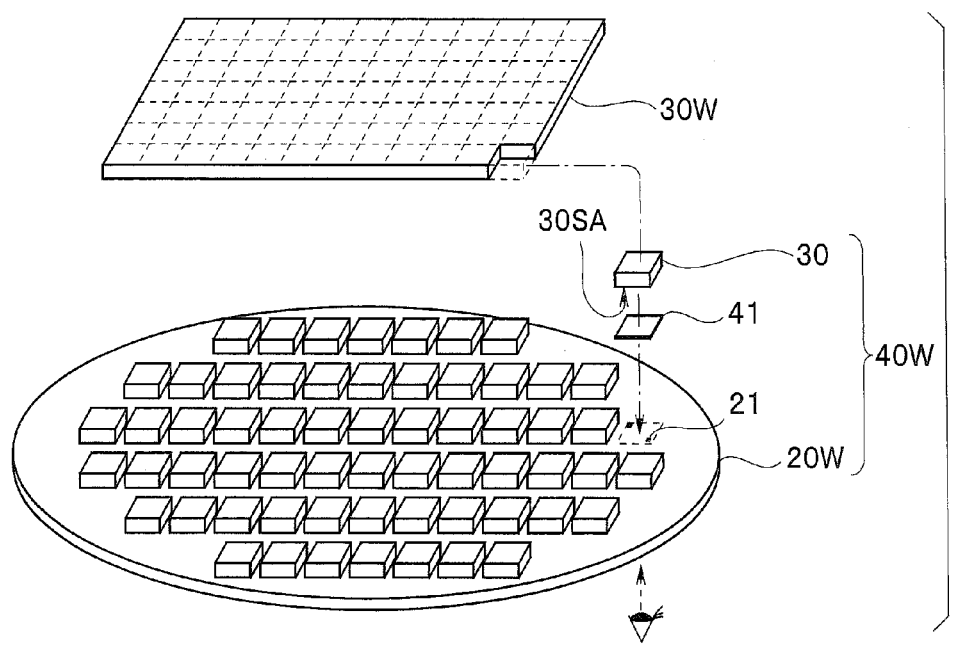
FIG. 2 is a perspective view for explaining a method for producing the image pickup apparatus of the first embodiment.

That is, in the image pickup apparatus 10, a plan-view dimension (outer dimension) of the cover glass 20 is larger than a plan-view dimension (outer dimension) of the image pickup chip 30. This is because the image pickup apparatus 10 is fabricated by cutting (individualizing) a joined wafer 40W where a plurality of image pickup chips 30 are bonded to a glass wafer 20W, which is a transparent support substrate that becomes the cover glass 20, away from each other by a predetermined length via the adhesive layer 41 as shown in FIG. 2. As described below, on the glass wafer 20W, an alignment mark 21 for arranging each of the image pickup chips 30 at a predetermined position is formed. That is, since the glass wafer 20W is transparent, the alignment mark (first alignment mark) 21 and an alignment mark (second alignment mark) 36 (see FIG. 5) on the image pickup chip 30 can be aligned with each other from an opposite face to a face where the alignment mark 21 is formed.

Figure 3A:
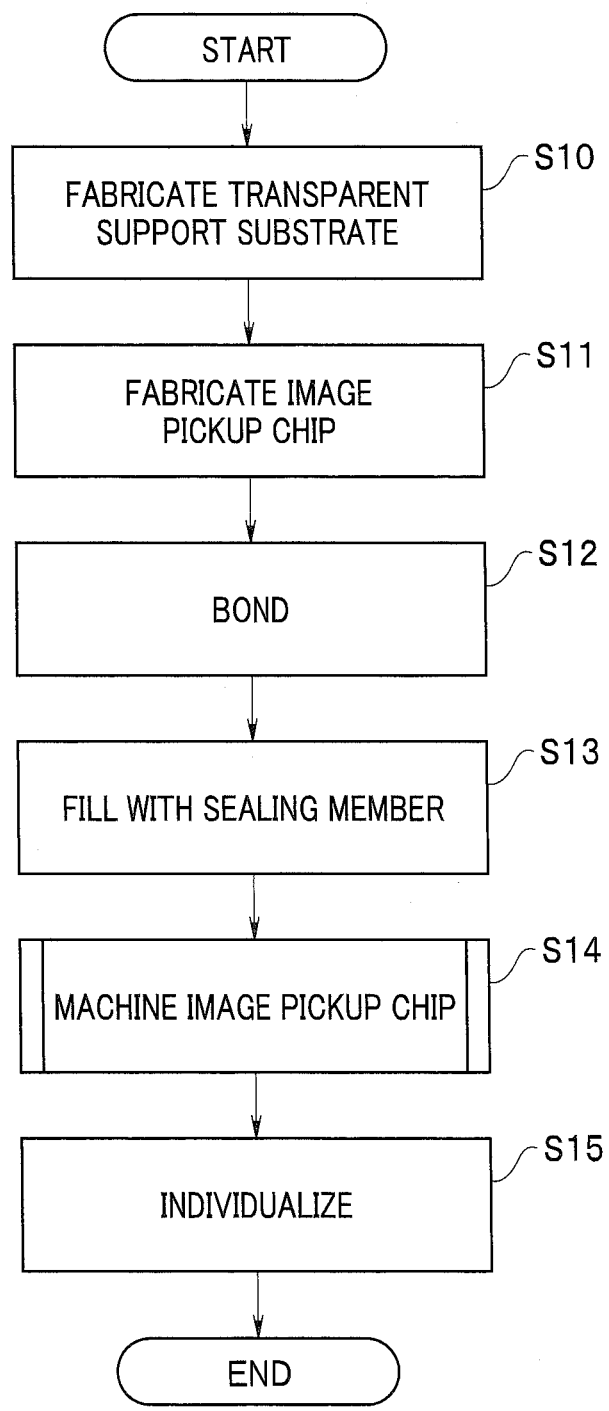
FIG. 3A is a flowchart for explaining the method for producing the image pickup apparatus of the first embodiment.
Figure 3B:
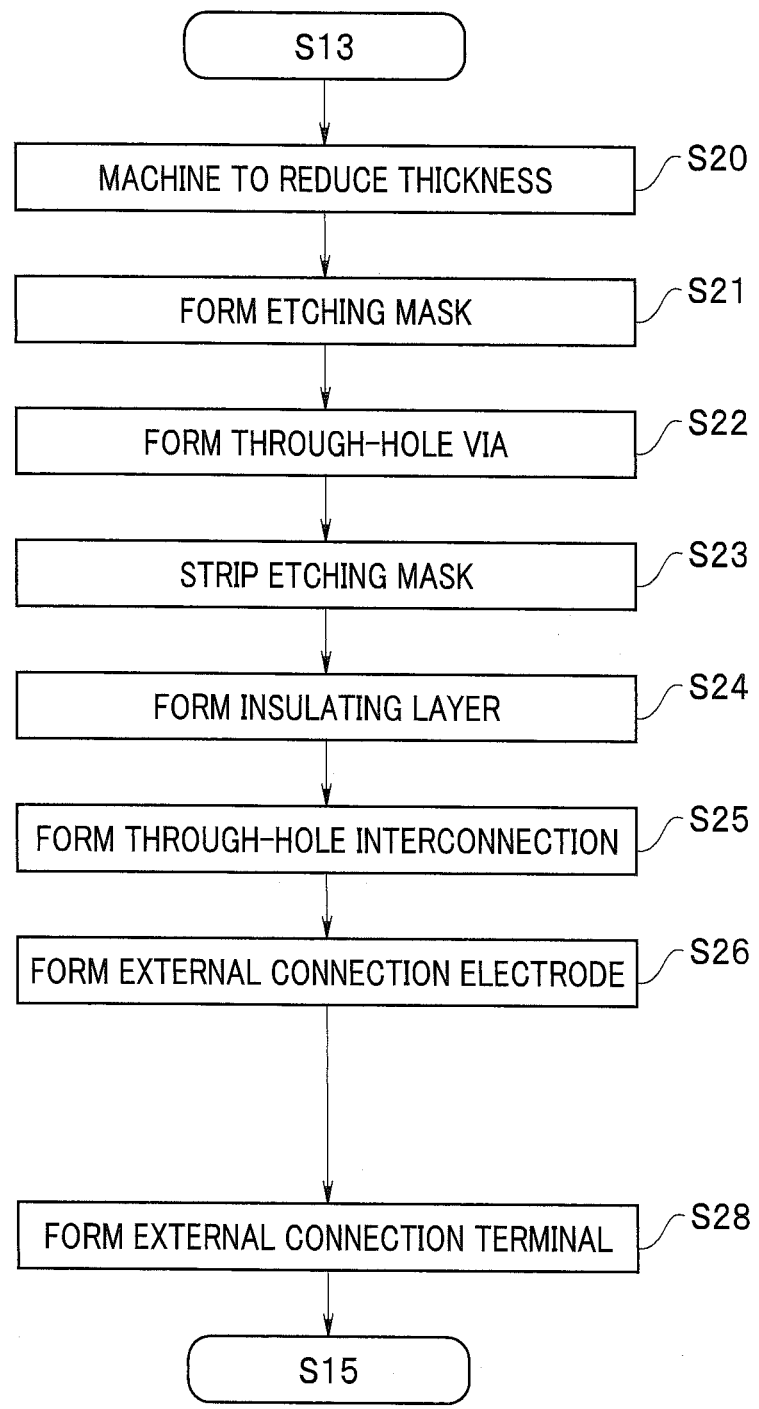
FIG. 3B is a flowchart for explaining the method for producing the image pickup apparatus of the first embodiment.

Next, a method for producing the image pickup apparatus 10 of the embodiment is described in detail based on flowcharts in FIGS. 3A and 3B.

<Step 10> Glass Wafer Fabricating Process

Figure 4:
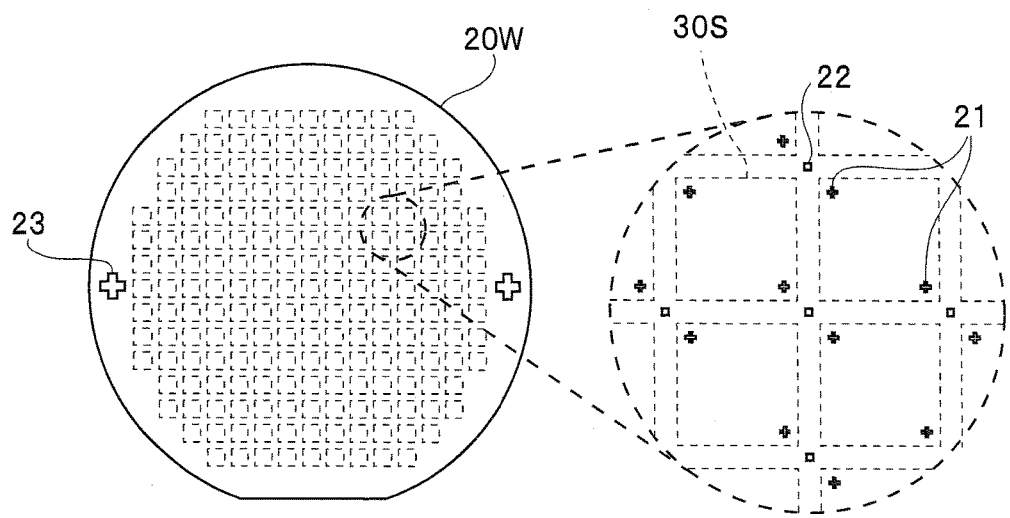
FIG. 4 is a plan view and a partially enlarged view of a transparent substrate of the image pickup apparatus of the first embodiment.

As shown in FIG. 4, the alignment marks 21 for arranging the image pickup chips 30 at predetermined positions are formed on the glass wafer 20W that is the transparent support substrate. Note that an image pickup chip arrangement region 30S is indicated by a broken line for the sake of description in FIG. 4. The glass wafer 20W that is cut to become the cover glass 20 only needs to be transparent in a wavelength band of light for image pickup. For example, borosilicate glass, quartz glass, or single crystal sapphire is used.

Note that alignment marks 22 and alignment marks 23 are formed at a same time as formation of the alignment marks 21. The alignment marks 22 are used for dicing at a time of individualization, and the alignment marks 23 are used for machining such as formation of the through-hole interconnection 33 in the image pickup chip 30. The alignment marks 21 and the like are formed by, for example, performing patterning by photolithography after forming a metal layer of Al or the like on an entire face. It is preferable that two alignment marks are provided for one time of positioning processing for the respective alignment marks so as to perform accurate positioning. Note that the alignment marks 21 and the like may be also formed by partially etching the glass wafer 20W.

Note that a back face of the glass wafer 20W (the opposite face to the face where the alignment marks 21 are formed), which is not machined in following processes, may be covered with a photoresist or the like to be protected.

<Step 11> Image Pickup Chip Fabricating Process

Figure 5:
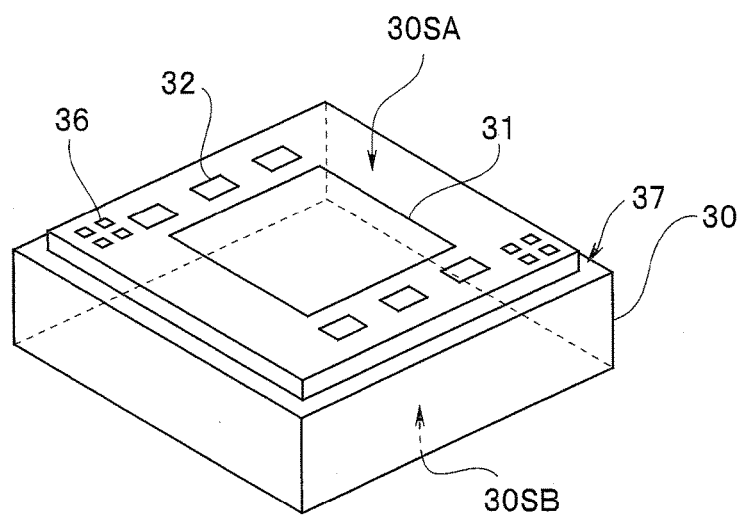
FIG. 5 is a perspective view of an image pickup chip of the image pickup apparatus of the first embodiment.

The plurality of light receiving sections 31 that are the semiconductor circuit sections, the plurality of electrode pads 32 connected to each of the light receiving sections 31, and the plurality of alignment marks 36 are formed on the first main face 30SA of a semiconductor wafer such as a silicon wafer by a known semiconductor process, so that an image pickup chip substrate 30W (see FIG. 2) is fabricated. By cutting and individualizing the image pickup chip substrate (semiconductor chip substrate) 30W, the plurality of image pickup chips (semiconductor chips) 30 shown in FIG. 5 are fabricated.

Sizes of the image pickup chip substrate and the glass wafer 20W are selected according to available production equipment or the like depending on a form and specifications etc. of the image pickup apparatus to be produced. Also, the image pickup chip substrate and the glass wafer 20W may be set to different sizes. For example, even when the image pickup chips are formed from a substrate having a large diameter of 12-inch (300-mm)φ, or from a still larger substrate, the individualized image pickup chips 30 are re-arrayed (bonded) on the glass wafer 20W of 8-inch (200-mm)φ, and subjected to machining. Accordingly, it becomes possible to produce the image pickup apparatus by equipment for 8-inch (200-mm)φ without using equipment or the like compatible with a large-diameter wafer. Moreover, a substrate and a wafer of different shapes, for example, the image pickup chip substrate of 8-inch (200-mm)φ and the glass wafer 20W of 6-inch (150-mm) squares, may be also used depending on equipment and apparatuses, etc. As described above, since the image pickup chip substrate and the glass wafer 20W of suitable sizes or shapes for available production equipment or the like (a production apparatus, a jig and a tool, etc.) can be used, the image pickup apparatus can be produced by effectively utilizing existing equipment or the like.

In following processes, only the image pickup chips 30 determined as non-defective products in an inspection process are used. That is, "defective chips" other than the non-defective products are not used in the following processes. Thus, even when a yield rate of the image pickup chips 30 of the image pickup chip substrate 30W is low, a decrease in yield rate of the image pickup chips obtained by re-arraying and re-machining the image pickup chips is not caused. Note that it is preferable to perform an inspection for determining defectiveness of the image pickup chips on the image pickup chips 30 in a state of the substrate 30W in view of work efficiency although the inspection may be performed on each of the individual image pickup chips 30 in an individualized state.

The alignment marks 36 correspond to the alignment marks 21 on the glass wafer 20W. As shown in FIG. 5, the alignment marks 36 are preferably formed respectively on outer peripheral portions facing each other with a center of the image pickup chip 30 therebetween. By previously forming the alignment marks on the glass wafer 20W and the image pickup chip 30, the image pickup chip 30 can be automatically placed with high precision by using a mounting apparatus.

Also, a step portion 37 is formed in the outer peripheral portions of the first main face 30SA of the image pickup chip 30. The step portion 37 is fabricated by dicing the image pickup chip substrate 30W by step cutting. The image pickup chip 30 with the step portion 37 can reduce a length L with an adjacent chip so as to prevent spread (a fillet) of an adhesive 41L to an outer side of the image pickup chip 30 when bonded to the glass wafer 20W. A micro lens group may be also disposed on the light receiving section 31.

<Step S12> Bonding Process

Figure 6A:
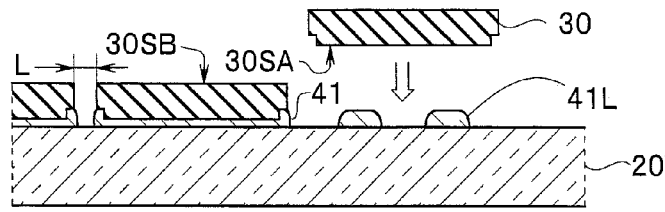
FIG. 6A is a sectional view for explaining the method for producing the image pickup apparatus of the first embodiment.

As shown in FIG. 6A, the plurality of image pickup chips 30 are bonded to the glass wafer 20W away from each other by the predetermined length L to fabricate the joined wafer 40W. That is, the plurality of image pickup chips 30 formed on the image pickup chip substrate 30W on predetermined array conditions are then re-arrayed on the glass wafer 20W after cutting.

The length L needs to be longer than a thickness of a dicing blade used in a dicing process described below. However, if the length L is too long, the number of image pickup apparatuses that can be fabricated from the single glass wafer 20W is decreased. At a same time, the sealing member has a larger volume in a sealing member filling process described below, and a curing shrinkage stress becomes larger, so that a crack is easily generated. Therefore, the length L is preferably 15 μm or more and 500 μm or less, which is slightly longer than the thickness of the dicing blade.

Also, by setting the length L to a constant value among all of the image pickup chips 30, workability can be improved, and uniform filling of the sealing member is enabled in the sealing member filling process described below. The crack caused by unevenness of the curing shrinkage stress can be thereby prevented.

For example, the adhesive 41L in a liquid form is first applied in an appropriate amount to five positions of the image pickup chip arrangement region 30S of the glass wafer 20W. The image pickup chip arrangement region 30S can be grasped by the two alignment marks 21 arranged on a diagonal line. For example, a dispensing method of pushing out a solution from a distal-end nozzle of a dispenser and applying the solution is used as an application method.

As the adhesive 41L, a BCB (benzocyclobutene) resin, an epoxy-based resin, or a silicone-based resin etc., which satisfies such properties that the adhesive has high transparency (for example, a transmittance at visible wavelengths is 90% or more), has high adhesive strength, and is not deteriorated by heat or the like in subsequent processes, is used.

The image pickup chip 30 is then bonded to the glass wafer 20W in a state in which the first alignment marks 21 on the glass wafer 20W and the second alignment marks 36 on the first main face 30SA of the image pickup chip 30 are aligned with each other by using, for example, a flip chip bonder. The first alignment marks 21 and the second alignment marks 36 are set so as to be easily aligned with each other. For example, the first alignment mark 21 has a cross shape as shown in FIG. 4, and the second alignment mark 36 is composed of four squares as shown in FIG. 5.

Note that a reference mark may be previously formed on the glass wafer 20W without forming the alignment marks exclusive for the respective image pickup chips, and the image pickup chips 30 may be arranged at a predetermined pitch based on the reference mark. A throughput can be raised by using the above method. Also, alignment may be performed by using a pattern of the electrode pads 32 or the like formed on the image pickup chip 30 instead of the second alignment marks 36.

The liquid adhesive 41L is cured in a state in which the alignment marks are aligned with each other, and becomes the adhesive layer 41. By completely curing the liquid adhesive 41L while pressing the second main face of the image pickup chip at a predetermined pressure by a wafer-shaped pressing jig, parallelism between the main face of the image pickup chip and the main face of the glass wafer 20W is increased.

As a method for curing the adhesive 41L, any of a thermal curing method, a UV curing method, the UV curing method+the thermal curing method, the UV curing method+a moisture curing method, and a room temperature curing method etc. may be employed depending on the resin as long as desired properties are satisfied. By using a flip chip bonder including means for curing the adhesive 41L, such as a heating section or an UV irradiation section, the arrangement of the image pickup chip 30 at a predetermined position, and the curing of the adhesive 41L can be performed at a same time.

Note that attention needs to be paid when the adhesive 41L where voids are easily generated by rapid curing is used although the adhesive 41L may be completely cured by the flip chip bonder. In this case, it is preferable that, for example, when the adhesive 41L is cured by the flip chip bonder, the adhesive 41L is semi-cured to an extent where the image pickup chip 30 disposed at a predetermined position does not move to cause displacement, and after the plurality of image pickup chips 30 are disposed on the glass wafer 20W, the adhesive 41L is completely cured at a time and formed into the adhesive layer 41.

<Step S13> Sealing Member Filling Process

Figure 6B:
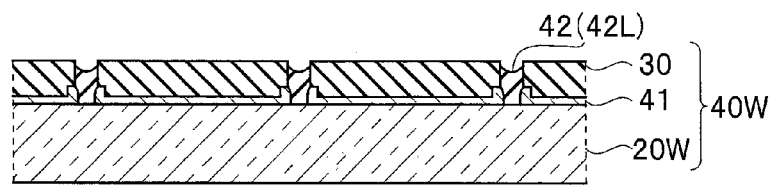
FIG. 6B is a sectional view for explaining the method for producing the image pickup apparatus of the first embodiment.

As shown in FIG. 6B, a sealing resin 42L in a liquid form that is filled into a gap between the plurality of image pickup chips 30 disposed on the glass wafer 20W by, for example, a dispensing method is cured to become the sealing member 42. The sealing resin 42L may be also poured into the gap instead of the dispensing method.

By setting the arrangement length L between the plurality of image pickup chips 30 to 15 μm or more and 500 μm or less, the sealing member can be filled into the gap between the plurality of image pickup chips 30 by a capillary tube phenomenon. Note that a region where vertexes of the plurality of image pickup chips 30 face each other tends to have a small height (thickness) when filled with the sealing resin 42L. Therefore, after the sealing resin is cured once, the sealing resin may be applied again only to the portion where the vertexes of the plurality of image pickup chips 30 face each other.

The sealing member 42 preferably has a low moisture vapor transmission rate so as to improve humidity resistance of the image pickup apparatus 10, and is difficult to deteriorate by heat or plasma in subsequent processes. For example, a BCB resin or polyimide is used. Note that the sealing member 42 may be made of a same material as or a different material from the adhesive layer 41.

Also, the sealing member 42 preferably has a function as a light shielding member that prevents entrance of external light into the light receiving section. To this end, even when the sealing member 42 is made of the same resin as the adhesive layer 41, the resin is preferably used by mixing a light shielding material such as a dye or a black pigment therein. Note that a non-conductive material is used when the pigment or the like is used since the sealing member 42 needs to be an insulator.

A thickness of the sealing member 42, namely, a height to be filled only needs to be larger than a thickness of the image pickup chip 30 after thinning in step S14. That is, it is not necessary to completely fill the space between the plurality of image pickup chips 30 with the sealing member 42 before the thinning machining Conversely, the sealing member 42 may protrude from the space between the image pickup chips 30.

Note that it is not preferable to perform rapid heating or rapid cooling in the curing of the sealing resin 42L in order to prevent the crack occurrence due to the shrinkage stress when the sealing resin 42L is cured. Also, it is preferable that the sealing resin 42L is defoamed in vacuum before curing, or is cured in vacuum in order to prevent the occurrence of voids.

Note that the sealing member 42 is not limited to the cured liquid resin. For example, a sheet-like resin member may be cured after filling the space between the image pickup chips 30 wile embedding the image pickup chips 30 by vacuum hot pressing or vacuum laminating <Step S14> Image Pickup Chip Machining Process An image pickup chip machining subroutine is shown in FIG. 3B.

<Step S20> Thickness Reduction Machining Process

Figure 6C:
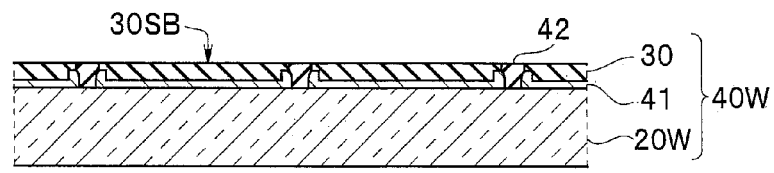
FIG. 6C is a sectional view for explaining the method for producing the image pickup apparatus of the first embodiment.

As shown in FIG. 6C, the joined wafer 40W is thinned, so that an image pickup chip bonded face (the second main face 30SB) side is flattened. That is, a back grinding process and a CMP (chemical mechanical polishing) process are performed from the second main face 30SB side.

In the back grinding process, a diamond wheel called a back grinding wheel is used. The CMP process is performed for reducing surface roughness of a surface grinded in the back grinding process.

Note that when a surface of the joined wafer 40W has large irregularities after being filled with the sealing member, preprocessing by another means is preferably performed before the back grinding process. For example, as the preprocessing, the sealing member 42 protruding from the gap between the image pickup chips 30 is shaved by a blade.

Note that dishing, which forms a recess in a center portion of the surface of the sealing member 42, may occur by the back grinding process and the CMP process. However, since the recessed portion is removed in the dicing process, there occurs no problem.

The second main face 30SB of the image pickup chip 30 and the surface of the sealing member 42 on the joined wafer 40W after thinning form a flat face. Therefore, a similar process to that of a normal semiconductor wafer can be performed on the thinned joined wafer 40W.

Figure 6D:
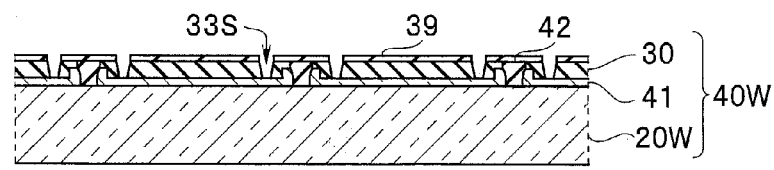
FIG. 6D is a sectional view for explaining the method for producing the image pickup apparatus of the first embodiment.

That is, as shown in FIG. 6D, a through-hole via 33S for forming the through-hole interconnection 33 that is connected to the electrode pad 32 formed on the first main face 30SA of the image pickup chip 30 is formed by the normal semiconductor wafer process.

<Step S21> Etching Mask Forming Process

As shown in FIG. 6D, to form the through-hole via, an etching mask 39 having an opening in a region immediately above each of the electrode pads 32 is formed on the image pickup chips 30 and the sealing member 42. The etching mask 39 also serves as a protective layer for protecting the image pickup chips 30 and the sealing member 42 from chemicals and plasma used in a subsequent process.

As the etching mask 39, an inorganic film such as a silicon oxide film or a silicon nitride film, or an organic film such as a photoresist, polyimide, or BCB is used. When the inorganic film is used as the etching mask 39, the inorganic film is formed by using plasma CVD or optical CVD. Since the film formation methods are performed at low temperature, no damage is caused on the semiconductor circuit section (the light receiving section 31) or the like formed on the image pickup chip 30. As a source gas when the silicon oxide film is formed, tetraethoxysilane (TEOS) or octamethylcyclotetrasiloxane (OMCTS) etc. is used. Also, as a source gas when the silicon nitride film is formed, a mixture gas such as $SiH_4+NH_3$, $SiH_2CL_2+NH_3$, $SiH_4+N_2$, or $SiH_4+NH_3+N_2$ is used.

On the other hand, when the organic film is used as the etching mask 39, the organic film is formed by spin coating, spray coating, or screen printing, etc.

To strip the etching mask 39 in a subsequent process, the etching mask 39 made of a different material from the sealing member 42 is used. For example, when the sealing member 42 is made of polyimide, for example, the silicon oxide film or the silicon nitride film is used as the etching mask 39. Since the film formation can be performed at low temperature as the method for forming the etching mask 39, and no damage is caused on the semiconductor circuit section or the like formed on the image pickup chip 30, plasma CVD is preferably used.

Note that the alignment marks 23 for forming the through-hole interconnection, which are previously formed on the glass wafer 20W, are used for alignment of a photo mask used when a patterning mask (not shown) for forming the opening in the etching mask 39 is formed.

When the silicon oxide film, the silicon nitride film, or a non-photosensitive resin is used as the etching mask 39, the mask is etched with a photoresist with an opening pattern to form the opening. In the silicon oxide film or the like, dry etching using a fluorine-based gas such as $CF_4$, $CHF_3$, or $C_2F_6$ is performed. On the other hand, when a photosensitive resin is used, the etching mask 39 with the opening can be formed by photolithography patterning.

<Step S22> Through-Hole Via Forming Process

The through-hole via 33S is formed using the etching mask 39 by the normal semiconductor wafer process.

For example, the through-hole via 33S reaching the electrode pad 32 is formed by wet etching using an alkali solution such as KOH or TMAH, or dry etching by an ICP-RIE method or the like.

The through-hole via 33S formed by the wet etching has a tapered shape where an opening size in the first main face 30SA is smaller than an opening size in the second main face 30SB. This is because when the image pickup chip 30 is made of single crystal silicon (100), anisotropic etching is caused in which an etching rate in a <100> plane direction is relatively higher than an etching rate in a <111> plane direction.

Furthermore, in the etching of the through-hole via 33S, side etching occurs in which the opening size in the second main face 30SB becomes larger than an opening size in the etching mask 39. Therefore, the opening size in the etching mask 39 is set to be smaller than a target opening size in the second main face 30SB. In the through-hole via forming process, the etching mask 39 protects the sealing member 42 from the alkali solution.

Note that the through-hole via 33S may be also formed by the dry etching such as ICP-RIE, or a physical machining method such as laser machining.

<Step S23> Etching Mask Stripping Process

The etching mask 39 is stripped. As a stripping method, a removing method with high etch selectivity between the etching mask 39 and the sealing member 42 is selected. For example, when the sealing member 42 is made of polyimide and the etching mask 39 is the silicon oxide film, a wet stripping method using a fluorine-based solution such as BHF is used.

<Step S24> Insulating Layer Forming Process

Figure 6E:
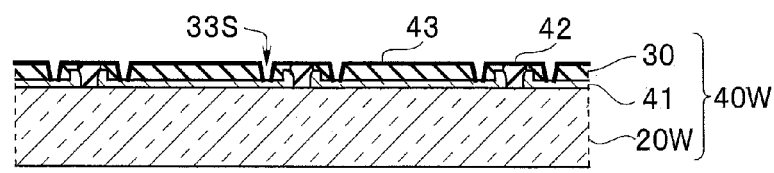
FIG. 6E is a sectional view for explaining the method for producing the image pickup apparatus of the first embodiment.

As shown in FIG. 6E, the insulating layer 43 is formed in which an opening is patterned in a bottom face of the through-hole via 33S such that the electrode pad 32 is exposed with the second main face 30SB of the image pickup chip 30, the surface of the sealing member 42, and a wall face of the through-hole via 33S covered. An insulating material similar to that of the etching mask 39 is used for the insulating layer 43. As a method for forming the insulating layer and a method for patterning the opening, a formation method similar to or different from that of the etching mask 39 may be employed.

Since the insulating layer 43 is not stripped in following processes, the insulating layer 43 protects the sealing member 42 in the following processes. For example, the insulating layer 43 protects the sealing member 42 from chemical treatment or plasma treatment during patterning in a through-hole interconnection forming process in step S25.

<Step S25> Through-Hole Interconnection Forming Process

Figure 6F:
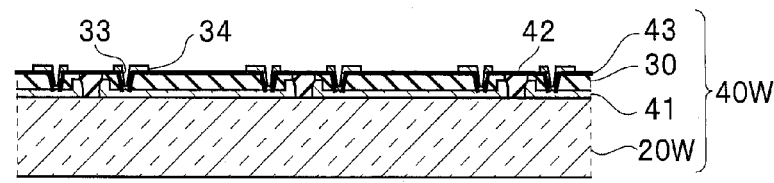
FIG. 6F is a sectional view for explaining the method for producing the image pickup apparatus of the first embodiment.
Figure 6G:
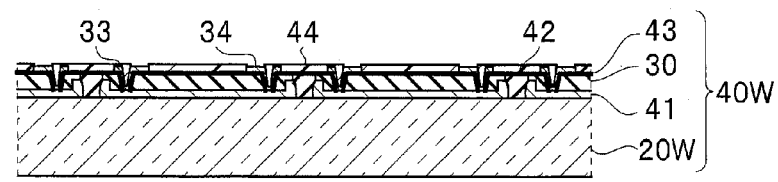
FIG. 6G is a sectional view for explaining the method for producing the image pickup apparatus of the first embodiment.
Figure 6H:
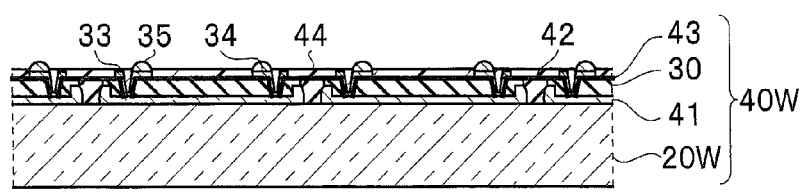
FIG. 6H is a sectional view for explaining the method for producing the image pickup apparatus of the first embodiment.

As shown in FIG. 6F, the through-hole interconnection 33 composed of a conductor is formed in an inner portion (the bottom face and the wall face) of the through-hole via 33S. The through-hole interconnection 33 is formed by patterning after forming a conductive film of aluminum or copper etc. using a sputtering method or a deposition method. Note that a plating process may be used in the through-hole interconnection forming process.

<Step S26> External Connection Electrode Forming Process

After the etching mask 39 is removed, the external connection electrode 34 connected to the through-hole interconnection 33 is formed on the second main face 30SB of the image pickup chip 30. Note that the external connection electrode 34 may be also formed at a same time as the formation of the through-hole interconnection.

<Step S28> External Connection Terminal Forming Process

The projecting external connection terminal 35 for effecting electrical connection with outside is disposed on the external connection electrode 34. A gold stud bump, or a solder ball etc. is used for the external connection terminal 35.

<Step S15> Individualizing Process (Dicing Process)

A plurality of image pickup apparatuses 10 are fabricated from the single joined wafer 40W by an individualizing process of cutting the joined wafer 40W.

Figure 6I:
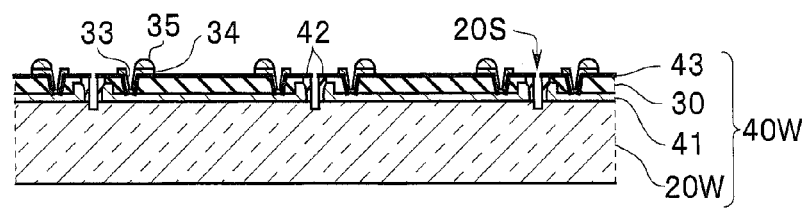
FIG. 6I is a sectional view for explaining the method for producing the image pickup apparatus of the first embodiment.
Figure 6J:
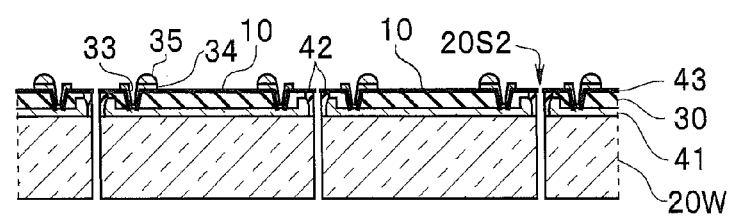
FIG. 6J is a sectional view for explaining the method for producing the image pickup apparatus of the first embodiment.

For cutting, a two-stage dicing method shown in FIGS. 6I and 6J is preferable. That is, after the joined wafer 40W is half-cut to about 10 to 200 μm from a surface of the glass wafer 20W (an upper side in the drawings), the glass wafer 20W is subjected to full-cut dicing, so that a crack occurrence due to a stress and stripping of the sealing member 42 can be prevented. Moreover, in the two-stage dicing method, a blade type (a bond material, an abrasive grain diameter, a degree of concentration) and machining conditions (a feed speed, a rotation speed) suitable for resin are used for dicing the sealing member 42, and a blade type and machining conditions suitable for glass are used for dicing the glass wafer 20W. A machining quality (resin burrs, chipping of glass, and delamination of a resin layer) can be thereby improved. Also, step cutting by which a step is formed in end portions of the individualized image pickup chips 30 may be performed by setting the blade for resin to a larger thickness than the blade for glass.

Also, the glass wafer 20W may be subjected to full-cut dicing by blade dicing for glass or laser dicing, and thereby individualized after removing the sealing member 42 on a dicing line by laser dicing or etching.

In alignment of dicing, the alignment marks 22 firstly formed on the glass wafer 20W are used. Note that, instead of the alignment marks 22, an alignment mark for dicing may be formed on the second main face 30SB of the image pickup chip 30 or on the sealing resin between the image pickup chips 30 in the through-hole interconnection forming process or the like.

In the production method of the embodiment, even when the image pickup chip substrate 30W has a low yield rate of image pickup devices, the joined wafer 40W is fabricated by using only the non-defective image pickup chips 30. Therefore, the defective chip is not produced into the image pickup apparatus, so that the image pickup apparatus 10 can be produced at low cost, and productivity is high.

Also, in the production method of the embodiment, the image pickup apparatus can be produced by using the joined wafer 40W with a predetermined diameter regardless of the diameter of the image pickup chip substrate 30W. Since machining equipment compatible with a large diameter is unrequired, productivity is high.

Moreover, since the image pickup chip with a large thickness before being machined is bonded to the glass wafer 20W, the image pickup chip is easily handled. That is, the image pickup chip that is thinned for forming the through-hole interconnection is easily damaged, and easily deformed by a stress during bonding or the like. However, in the production method of the embodiment, the image pickup chip in a thick state can be bonded to the glass wafer 20W.

Also, since the support substrate is the transparent glass wafer 20W, alignment using the alignment marks can be performed from the opposite face to the image pickup chip bonded face as shown in FIG. 2.

Furthermore, when the joined wafer 40W is machined from the second main face 30SB side by the wafer process, the sealing member 42 is covered with and protected by the etching mask 39 or the insulating layer 43. Therefore, the sealing member 42 is not deteriorated, so that the highly-reliable image pickup apparatus can be produced by the production method of the image pickup apparatus of the embodiment.

Also, since the chip arrangement length is set to a constant value, it is easy to fill the sealing resin 42L, thereby preventing the crack in the sealing resin 42L. Thus, a production yield rate is high.

Moreover, the image pickup chip 30 and the sealing member 42 can be treated as a single wafer by the flattening machining for making the outer face of the image pickup chip 30 and the outer face of the sealing member 42 flush with each other by the CMP. Thus, the semiconductor wafer process can be performed on a chip-shaped component, and high-precision and high-density machining can be performed.

The image pickup apparatus 10 includes the image pickup chip 30 that is the semiconductor chip where the light receiving section 31 that is the semiconductor circuit section is formed on the first main face 30SA, the cover glass 20 that is the support substrate section having a larger plan-view dimension than the image pickup chip 30, the transparent adhesive layer 41 that bonds the first main face 30SA of the image pickup chip 30 and the cover glass 20, and the sealing member 42 that covers a side face of the image pickup chip 30 and a side face of the adhesive layer 41, and is made of an insulating material having a same outer dimension (plan-view dimension) as the cover glass 20.

In an image pickup apparatus fabricated by a conventional W-CSP method, a joined substrate obtained by joining a glass wafer and an image pickup device substrate is cut. Thus, an image pickup chip and a support substrate section have a same plan-view dimension (outer dimension). On the contrary, the side face of the image pickup chip 30 is covered with the sealing member 42, and the image pickup chip 30 is not exposed outside. Moreover, the second main face 30SB of the image pickup chip 30 is covered with the insulating layer 43 except for the external connection terminal 35. That is, all the surfaces of the image pickup chip 30 are electrically insulated. Therefore, the image pickup apparatus 10 has excellent electrical insulating properties and humidity resistance.

Note that a functional member may be further added to the image pickup apparatus 10 of the above embodiment. For example, an objective lens unit may be joined to the opposite face to the face of the glass wafer 20W where the image pickup chip 30 is bonded in alignment with the image pickup chip 30. Also, a digital signal processor (DSP) chip for processing an image pickup signal may be joined to the second main face 30SB of the image pickup chip 30.

A backside irradiation-type image pickup apparatus may be also produced through processes of bonding an interconnection layer side of the image pickup chip 30 to the support substrate, filling the sealing resin into the gap between the image pickup chips 30, thinning the image pickup chip 30 to about 3 μm to expose the light receiving section 31, thereafter forming a color filter and a micro lens on the light receiving section 31, and removing a silicon layer on the electrode to expose the electrode.

Also, the semiconductor chip is not limited to the image pickup chip, and any type, such as general semiconductor chips, various sensors or actuators, may be employed. The semiconductor apparatus to be produced is also not limited to the image pickup apparatus.

Since the image pickup apparatus of the above embodiment and modifications has high reliability while being ultra-small, the image pickup apparatus can be preferably used particularly as an image pickup apparatus disposed at a distal end portion of an electronic endoscope, or disposed in a capsule endoscope.

<Modification of the First Embodiment>

Next, image pickup apparatuses 10A to 10D of Modifications 1 to 4 of the image pickup apparatus 10 in the first embodiment of the present invention are described. Since the image pickup apparatuses 10A to 10D of the modifications are similar to the image pickup apparatus 10 of the embodiment and have the same effects, same constituent elements are assigned same reference numerals, and description is omitted.

Figure 7:
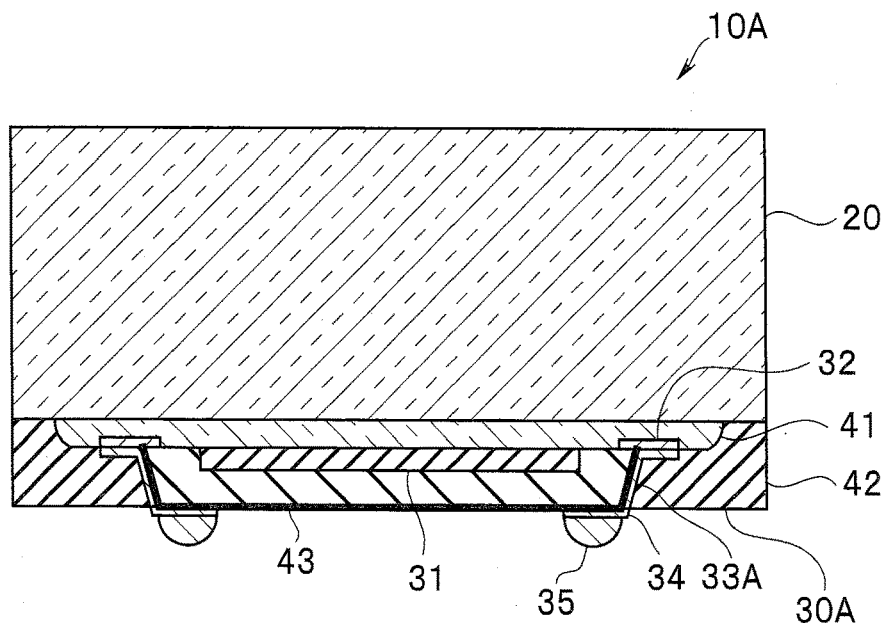
FIG. 7 is a sectional view of an image pickup apparatus of Modification 1 of the first embodiment.

As shown in FIG. 7, in the image pickup apparatus 10A of the modification, an image pickup chip 30A has a trapezoidal section. The electrode pad 32 on the first main face 30SA and the external connection electrode 34 on the second main face 30SB are connected by a side face interconnection 33A formed on the side face of the image pickup chip 30A. The side face of the image pickup chip 30A is covered with the sealing member 42.

It is easier to form the side face interconnection 33A than the through silicon via (TSV) and the through-hole interconnection. Therefore, it is easier to produce the image pickup apparatus 10A than the image pickup apparatus 10.

Figure 8:
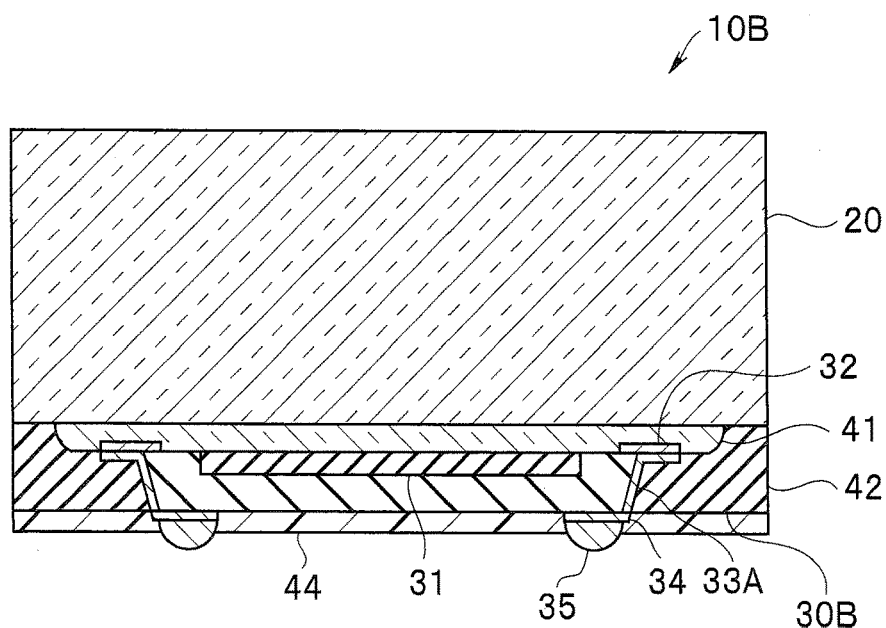
FIG. 8 is a sectional view of an image pickup apparatus of Modification 2 of the first embodiment.

Next, in the image pickup apparatus 10B of Modification 2 shown in FIG. 8, the protective layer 44 covers the external connection terminal formation region of the second main face 30SB of an image pickup chip 30B. That is, the protective layer 44 has an opening where a portion of the external connection electrode 34 is exposed. The protective layer 44 may be formed of a material and by a formation method similar to those of the etching mask 39 or the like, or of a different material and by a different formation method therefrom.

Since it is not necessary to form the insulating layer 43, it is easier to produce the image pickup apparatus 10B than the image pickup apparatus 10.

Of course, the protective layer 44 may be also formed on the image pickup apparatus 10 or the image pickup apparatus 10A.

Figure 9A:
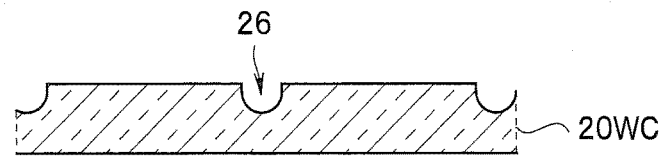
FIG. 9A is a sectional view for explaining a method for producing an image pickup apparatus of Modification 3 of the first embodiment.

Next, the image pickup apparatus 10C of Modification 34 is described. As shown in FIG. 9A, when the image pickup apparatus 10C is produced, a frame-like groove 26 is formed by, for example, a dicing blade in outer peripheral portions around the respective image pickup chip arrangement regions 30S of a glass wafer 20WC before the bonding process. The groove 26 may be formed by etching.

Figure 9B:
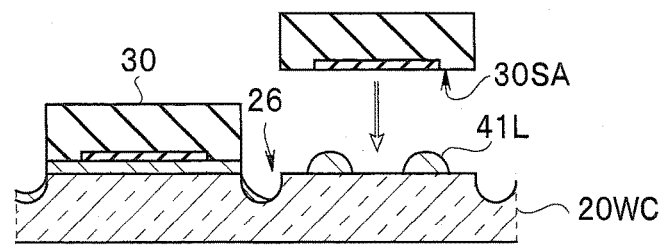
FIG. 9B is a sectional view for explaining the method for producing the image pickup apparatus of Modification 3 of the first embodiment.
Figure 9C:
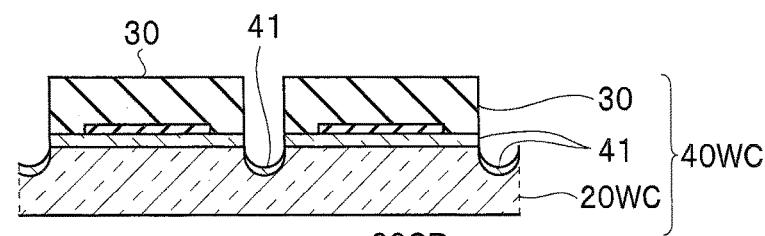
FIG. 9C is a sectional view for explaining the method for producing the image pickup apparatus of Modification 3 of the first embodiment.

As shown in FIGS. 9B and 9C, an image pickup chip 30C is heated and pressurized in an aligned state, and bonded to the glass wafer 20WC by using, for example, a flip chip bonder. In the image pickup apparatus 10C, an excess amount of the adhesive 41L flows into the groove 26. Therefore, a fillet is not spread horizontally (a main face parallel direction) or vertically (a main face perpendicular direction). Since the fillet is not spread horizontally, more image pickup apparatuses 10C can be fabricated from a single joined wafer 40WC by reducing the arrangement length L between the image pickup chips 30.

Figure 9D:
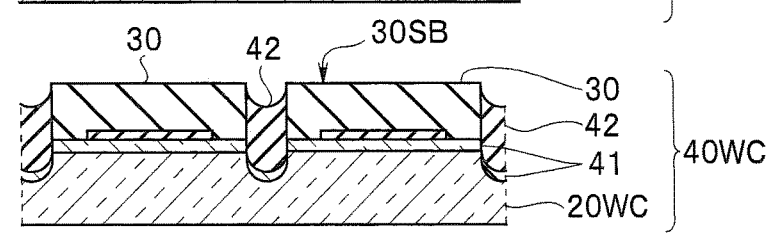
FIG. 9D is a sectional view for explaining the method for producing the image pickup apparatus of Modification 3 of the first embodiment.
Figure 9E:
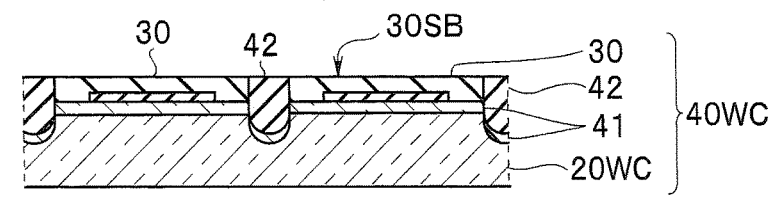
FIG. 9E is a sectional view for explaining the method for producing the image pickup apparatus of Modification 3 of the first embodiment.
Figure 9F:
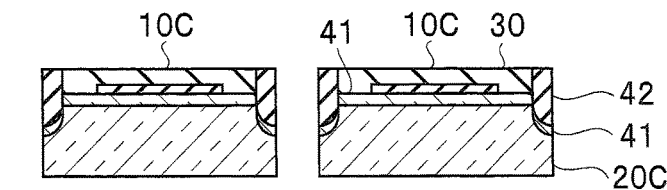
FIG. 9F is a sectional view for explaining the method for producing the image pickup apparatus of Modification 3 of the first embodiment.

Also, as shown in FIGS. 9D to 9F, since the fillet of the adhesive 41L is not spread vertically, the sealing member 42 is surely filled up to the outer peripheral portions of the image pickup chip 30 in the sealing member filling process in the image pickup apparatus 10C. A resin having a higher sealing effect than that of the adhesive layer 41 can be used for the sealing member 42.

Figure 10:
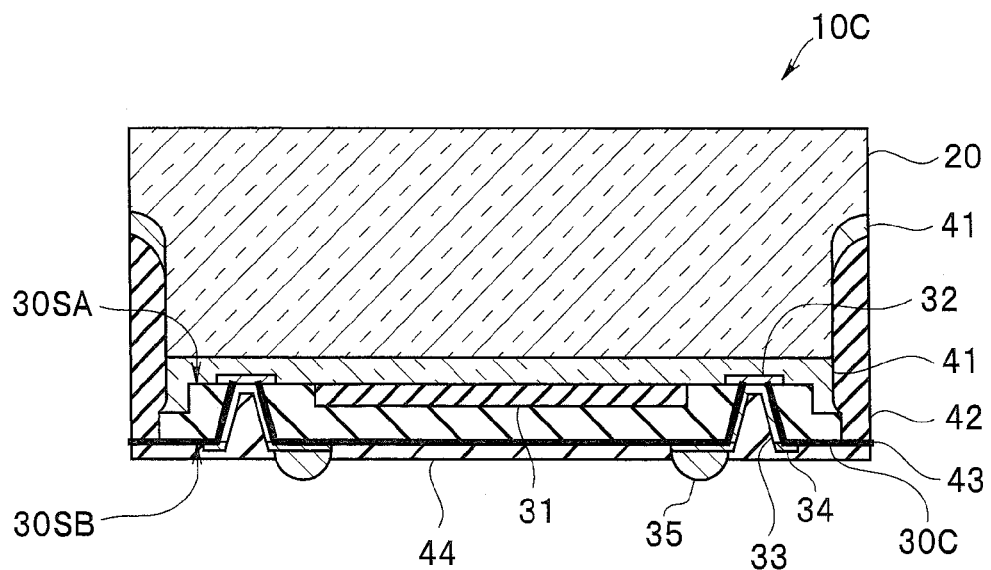
FIG. 10 is a sectional view of the image pickup apparatus of Modification 3 of the first embodiment.

Therefore, the image pickup apparatus 10C shown in FIG. 10 has higher reliability than the image pickup apparatus 10 or the like where the adhesive layer 41 is exposed on an outer face.

Moreover, a wall face and a bottom face of the groove 26 formed by the dicing blade have, for example, a large arithmetic average roughness: Ra (JIS B 0601:2001) of 0.15 μm or more as surface roughness. Therefore, stray light that is light incident in a direction of the groove 26 is scattered. That is, there is no possibility that the stray light is reflected and enters the light receiving section 31 as in a groove whose inner face has small surface roughness.

Figure 11:
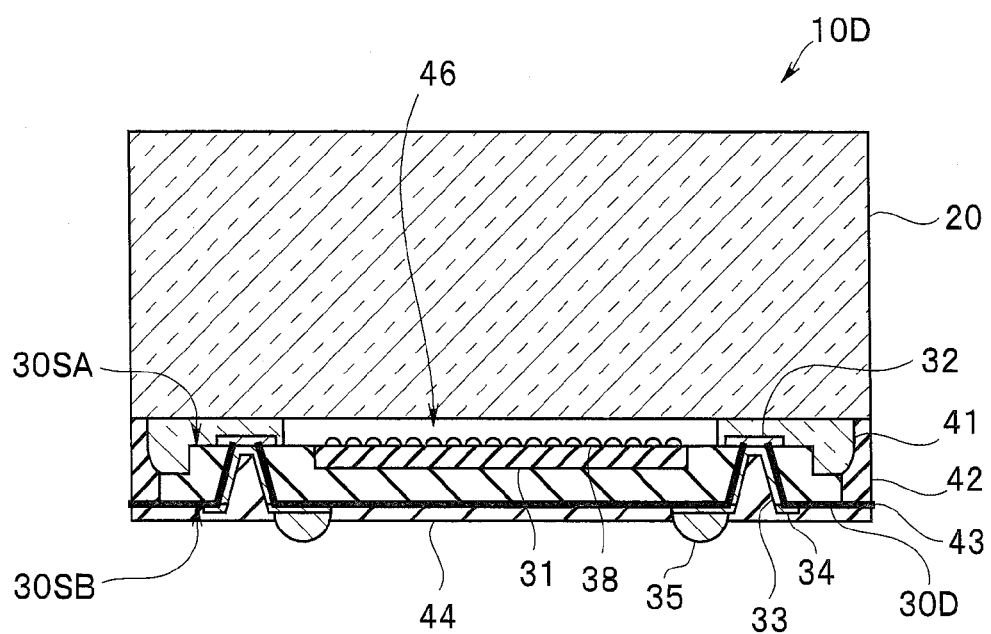
FIG. 11 is a sectional view of an image pickup apparatus of Modification 4 of the first embodiment.

Next, as shown in FIG. 11, in the image pickup apparatus 10D of Modification 4, an image pickup chip 30D includes micro lenses 38 on the light receiving section 31, and a cavity (air gap portion) 46 is provided between the light receiving section 31 and the cover glass 20. The micro lenses 38 are respectively formed corresponding to pixels of the light receiving section 31. Sensitivity of the image pickup apparatus 10D is improved by increasing light collection efficiency.

Air or an inert gas is injected to an inner portion of the cavity 46. When moisture or the like intrudes into the inner portion from outside, condensation occurs on a back face of the cover glass 20 or a surface of the image pickup chip 30D. Thus, an image may become unclear at a time of image pickup. However, in the image pickup apparatus 10D, since the cavity 46 is sealed by the sealing member 42, humidity resistance is improved.

<Second Embodiment>

Next, an image pickup unit 1 of a second embodiment of the present invention is described. Since the image pickup unit 1 includes, for example, the image pickup apparatuses 10, 10A to 10D, same constituent elements are assigned same reference numerals, and description is omitted.

Figure 12:
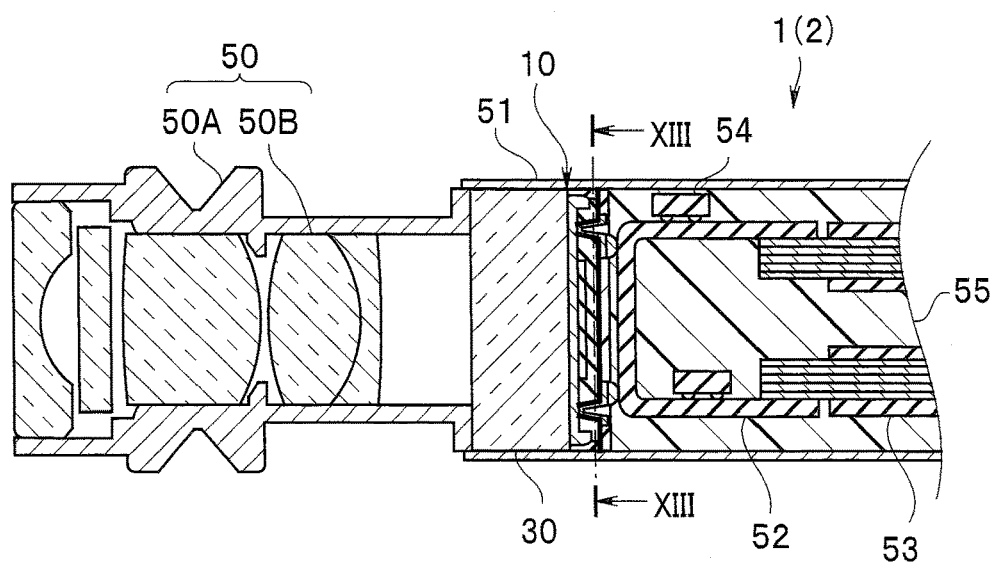
FIG. 12 is a sectional view of an image pickup apparatus of a second embodiment.

As shown in FIG. 12, in an endoscope 2, the image pickup unit 1 including the image pickup apparatus 10, a lens unit 50, an interconnection board 52, a signal cable 53, and a shield case 51 is disposed at a distal end portion of an insertion section. The lens unit 50 composed of a frame member 50A and an image pickup optical system 50B held in the frame member 50A forms an object image on the light receiving section of the image pickup apparatus 10. The interconnection board 52 is connected to the external connection terminal of the image pickup apparatus 10. The signal cable 53 is connected to the external connection terminal via the interconnection board 52. The image pickup apparatus 10 and the interconnection board 52 are accommodated in the shield case 51 made of a metal material, and a rear portion side of the image pickup apparatus 10 and the interconnection board 52 are sealed by a second sealing member 55. An electronic component 54 such as a chip capacitor is mounted on a surface of the interconnection board 52.

Figure 13:
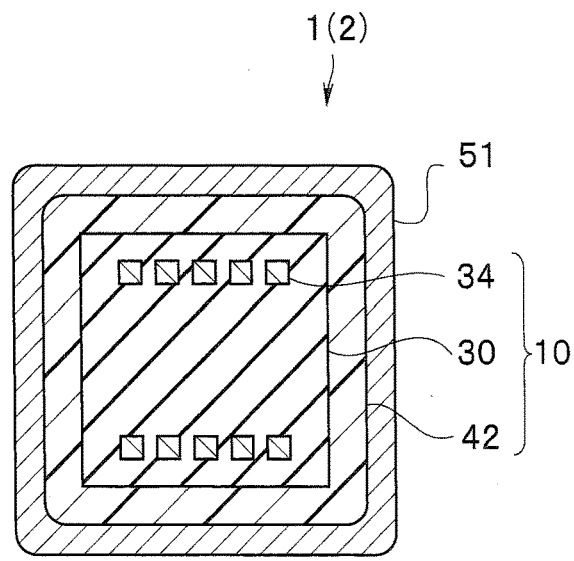
FIG. 13 is a sectional view taken along a line XIII-XIII in FIG. 12.

As shown in FIG. 13, since an outer periphery of the image pickup apparatus 10 is covered with the sealing member 42 made of the insulating material in the image pickup unit 1, there occurs no problem even when the image pickup apparatus 10 is in contact with the shield case 51 made of metal.

The second sealing member 55 is made of, for example, a resin with high thermal conductivity obtained by mixing a metal oxide into silicone rubber, and fixes the image pickup apparatus 10, the interconnection board 52, and the signal cable 53 etc. to an inner portion of the shield case 51. The shield case 51 electrically shields the image pickup apparatus 10, and not only mechanically reinforces the image pickup apparatus 10, but also significantly reinforces a sealing function of the image pickup apparatus 10.

As already described, in the image pickup apparatus fabricated by the conventional W-CSP method, a side face of the image pickup chip composed of a semiconductor is exposed on an outer face. Therefore, when the side face of the image pickup chip comes into contact with the shield case made of metal, a malfunction could be caused. It is thus necessary to electrically insulate the side face of the image pickup chip, so that an outer dimension (plan-view dimension) is increased.

The distal end portion of the endoscope is exposed to high temperature and high humidity in a disinfecting/sterilizing process or the like. Therefore, when a resin having a poor moisture vapor transmission rate is used for a sealing member of the image pickup chip of the image pickup apparatus, it is not easy to secure reliability of the image pickup apparatus. For example, it is assumed that moisture intrudes via the sealing resin. In a case in which a transparent adhesive layer exists between the light receiving section and the transparent support member, the adhesive layer is altered, and becomes locally opaque, which could be reflected in a picked-up image. Also, in a case in which an air gap of air or inert gas exists between the light receiving section and the transparent support member, the moisture intruding into the air gap forms condensation, which could also be reflected in a picked-up image.

On the contrary, in the image pickup apparatus 10, the outer face of the image pickup chip 30 is covered with any of the cover glass 20, the sealing member 42, and the insulating layer 43, and electrically insulated. Also, the insulating layer 43 has sealing properties for preventing intrusion of moisture or the like into an inner portion as well as insulating properties.

Therefore, since the image pickup apparatus 10 has high reliability while being ultra-small, the image pickup apparatus 10 can be preferably used particularly as an image pickup apparatus disposed at the distal end portion of the endoscope 2, or disposed in a capsule endoscope.

Moreover, as shown in a sectional view in a direction perpendicular to a longitudinal direction in FIG. 13, in the image pickup unit 1, a plan-view dimension of an inner face of the shield case 51 and a plan-view dimension of the sealing member 42 of the image pickup apparatus 10 are equal to each other, and the shield case 51 covers the entire outer periphery of the image pickup apparatus 10 closely with no gap therebetween. To accommodate the image pickup apparatus 10 within the shield case 51 in a close contact state, for example, the image pickup apparatus 10 is accommodated in a state in which the shield case 51 is heated and expanded, or a metal plate is bent along the image pickup apparatus 10, and end faces are joined to create the shield case 51. Also, a material, such as resin or glass, with a low moisture vapor transmission rate may be interposed between the shield case 51 and the image pickup apparatus 10.

As described above, the image pickup unit 1 includes the image pickup apparatuses 10, 10A to 10D or the like, and a side face of the sealing member of the image pickup apparatus is covered over the entire periphery with the shield case composed of a metal plate with an extremely low moisture vapor transmission rate in a close contact state with no gap (space), through which moisture possibly intrudes, therebetween.

Since the sealing resin of the image pickup apparatus 10 is covered with the shield case with no gap therebetween, moisture hardly intrudes via the sealing resin. Even when exposed to high temperature and high humidity, the image pickup unit 1 (the endoscope 2) can keep high reliability.
<Modification>

Next, Modifications 1 to 3 of the second embodiment are described. Since Modifications 1 to 3 are similar to the image pickup unit 1 (the endoscope 2) of the second embodiment, same constituent elements are assigned same reference numerals, and description is omitted.

Figure 14:
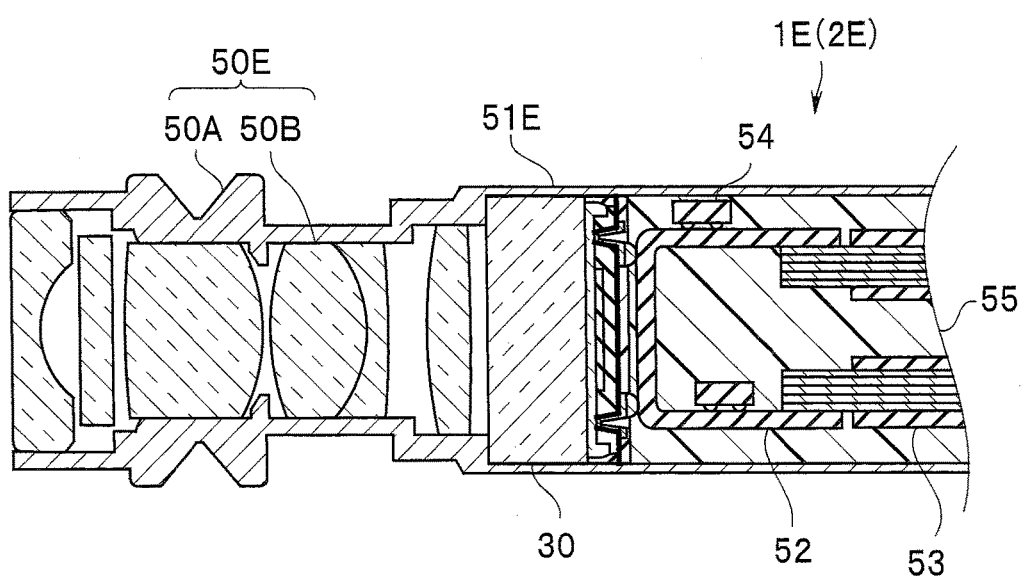
FIG. 14 is a sectional view of an image pickup apparatus of Modification 1 of the second embodiment.

In an image pickup unit 1E (an endoscope 2E) of Modification 1 shown in FIG. 14, a shield case 51E in which an image pickup apparatus 10E is accommodated integrally extends from a frame member 50E. The shield case 51E also has a function as the frame member 50A that holds some lenses of the image pickup optical system 50B. Since the frame member 50A and the shield case 51E are integrated in the image pickup unit 1E (the endoscope 2E), moisture intrusion from a joint between the frame member 50A and the shield case 51E does not occur. Thus, the endoscope 2E including the image pickup apparatus 10E (the image pickup unit 1E) has higher reliability.

Figure 15:
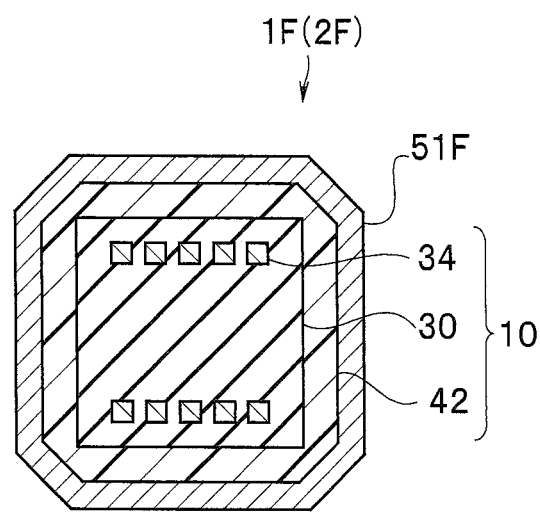
FIG. 15 is a sectional view of an image pickup apparatus of Modification 2 of the second embodiment.
Figure 16:
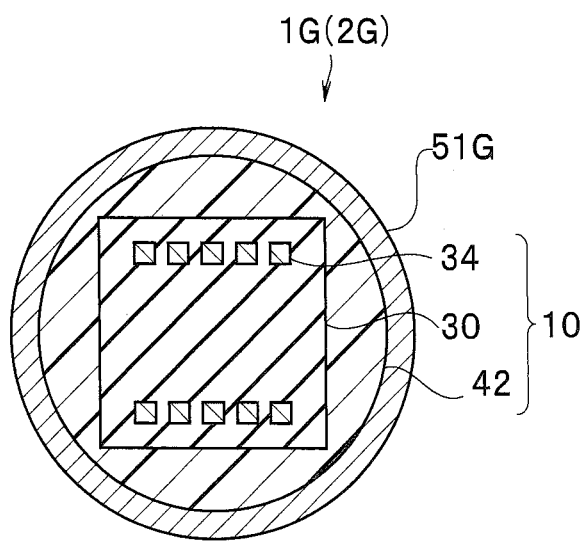
FIG. 16 is a sectional view of an image pickup apparatus of Modification 3 of the second embodiment.

Also, a sectional shape (plan-view shape) of a face perpendicular to the longitudinal direction of the shield case is not limited to an approximately square shape shown in FIG. 13. For example, corner portions may be largely chamfered as in a shield case 51F of an image pickup apparatus 10F (an image pickup unit 1F, an endoscope 2F) of Modification 2 shown in FIG. 15. A circular shape may be also employed as in a shield case 51G of an image pickup apparatus 10G (an image pickup unit 1G, an endoscope 2G) of Modification 3 shown in FIG. 15.

In any case, the image pickup chip is insulated by the sealing resin, and the shield case covers the outer periphery of the insulating resin with no gap therebetween. Thus, the image pickup apparatus (the image pickup unit, the endoscope) has high reliability.

The present invention is not limited to the aforementioned embodiments, and various changes, modifications etc. can be made therein without departing from the scope of the present invention.

What is claimed is:

1. An image pickup apparatus comprising:
   an image pickup chip including a light receiving section and electrode pads formed around the light receiving section, on a first main face, and a plurality of connection electrodes, each of which is connected to each of the electrode pads via each of a plurality of through-hole interconnections, on a second main face, the first and second main faces being separated in a height direction;
   a transparent support substrate section having a larger plan-view dimension than the image pickup chip;
   an adhesive layer that bonds the first main face of the image pickup chip and the support substrate section and covers the light receiving section, the adhesive layer made of an insulating resin of a benzocyclobutene (BCB) resin, an epoxy-based resin or a silicone resin, a transmittance of which is 90% or more at visible wavelengths; and
   a non-conductive sealing member that covers a side face of the image pickup chip and a side face of the adhesive layer, and has a same plan-view dimension as the support substrate section, the sealing member including a same insulating resin as the adhesive layer, with which a light shielding material composed of a non-conductive pigment is mixed;
   wherein the transparent support substrate has a groove on a side face thereof,
   insulating resin forming the adhesive layer overflows into and is disposed in a portion of the groove at a position separated from the adhesive layer in the height direction; and
   the non-conductive sealing member is disposed in another portion of the groove to at least entirely cover the side face of the image pickup chip and the side face of the adhesive layer.

2. A semiconductor apparatus comprising:
   a semiconductor chip including a semiconductor circuit section and electrode pads formed around the semiconductor circuit section, on a first main face, and a plurality of connection electrodes, each of which is connected to each of the electrode pads via each of a plurality of through-hole interconnections, on a second main face, the first and second main faces being separated in a height direction;
   a support substrate section having a larger plan-view dimension than the semiconductor chip;
   an adhesive layer that bonds the first main face of the semiconductor chip and the support substrate section and covers the semiconductor circuit section, the adhesive layer made of an insulating resin of a benzocyclobutene (BCB) resin, an epoxy-based resin or a silicone resin, a transmittance of which is 90% or more at visible wavelengths; and a non-conductive sealing member that covers a side face of the semiconductor chip and a side face of the adhesive layer, and has a same plan-view dimension as the support substrate section, the sealing member including a same insulating resin as the adhesive layer, with which a light shielding material composed of a non-conductive pigment is mixed;

wherein the support substrate has a groove on a side face thereof, insulating resin forming the adhesive layer overflows into and is disposed in a portion of the groove at a position separated from the adhesive layer in the height direction; and the non-conductive sealing member is disposed in another portion of the groove to at least entirely cover the side face of the semiconductor chip and the side face of the adhesive layer.

3. The semiconductor apparatus according to claim 2, wherein the second main face of the semiconductor chip is covered with an insulating layer.

4. The semiconductor apparatus according to claim 3, wherein a step portion is formed in an outer peripheral portion of a semiconductor chip bonded face of the support substrate section, and the semiconductor chip bonded face has a same plan-view dimension as the semiconductor chip.

5. The semiconductor apparatus according to claim 4, wherein the semiconductor apparatus is an image pickup apparatus in which the semiconductor circuit section is a light receiving section, and the support substrate section is made of a transparent material.

6. The semiconductor apparatus according to claim 5, wherein a cavity portion is formed between the light receiving section of the semiconductor chip and the support substrate section.

7. An image pickup unit comprising:

an image pickup apparatus comprising:

an image pickup chip including a light receiving section and electrode pads connected to the light receiving section, on a first main face, and a plurality of connection electrodes, each of which is connected to each of the electrode pads via each of a plurality of through-hole interconnections, on a second main face, the first and second main faces being separated in a height direction, a transparent support substrate section having a larger plan-view dimension than the image pickup chip, an adhesive layer that bonds the first main face of the image pickup chip and the support substrate section and covers the light receiving section, the adhesive layer made of an insulating resin of a benzocyclobutene (BCB) resin, an epoxy-based resin or a silicone resin, a transmittance of which is 90% or more at visible wavelengths, and a first sealing member that covers a side face of the image pickup chip and a side face of the adhesive layer, and has a same plan-view dimension as the support substrate section, the first sealing member including a same insulating resin as the adhesive layer, with which a light shielding material composed of a non-conductive pigment is mixed;

a lens unit that forms an object image on the light receiving section;

a signal cable that is connected to the connection electrodes via an interconnection board; and a shield case in which the image pickup apparatus and the interconnection board are sealed by a second sealing member and accommodated, and that is made of a metal material;

wherein the transparent support substrate has a groove on a side face thereof, insulating resin forming the adhesive layer overflows into and is disposed in a portion of the groove at a position separated from the adhesive layer in the height direction; and the first sealing member is disposed in another portion of the groove to at least entirely cover the side face of the image pickup chip and the side face of the adhesive layer.

8. The image pickup unit according to claim 7, wherein a plan-view dimension of an inner face of the shield case and the plan-view dimension of the first sealing member are equal to each other, and the shield case closely covers an entire outer periphery of the image pickup apparatus.

9. The image pickup unit according to claim 8, wherein the second main face of the image pickup chip is covered with an insulating layer.

10. The image pickup unit according to claim 9, wherein the image pickup unit is disposed in an endoscope.

11. The image pickup apparatus according to claim 1, wherein the insulating resin forming the adhesive layer that overflows into the groove and the non-conductive sealing member completely fill the groove.

12. The semiconductor apparatus according to claim 2, wherein the insulating resin forming the adhesive layer that overflows into the groove and the non-conductive sealing member completely fill the groove.

13. The image pickup unit according to claim 7, wherein the insulating resin forming the adhesive layer that overflows into the groove and the first sealing member completely fill the groove.

* * * * *